(12) United States Patent
Huang et al.

(10) Patent No.: US 9,425,361 B2
(45) Date of Patent: Aug. 23, 2016

(54) LIGHT-EMITTING DEVICE

(71) Applicant: EPISTAR CORPORATION, Hsinchu (TW)

(72) Inventors: Chi Hao Huang, Hsinchu (TW); Siou Huang Liou, Hsinchu (TW); Tz Chiang Yu, Hsinchu (TW); Jennhua Fu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/005,227

(22) Filed: Jan. 25, 2016

(65) Prior Publication Data

US 2016/0141458 A1    May 19, 2016

Related U.S. Application Data

(63) Continuation of application No. 14/681,291, filed on Apr. 8, 2015, now Pat. No. 9,263,643.

(30) Foreign Application Priority Data

Apr. 8, 2014    (TW) .............................. 103112952 A

(51) Int. Cl.
*H01L 33/40*    (2010.01)
*H01L 33/14*    (2010.01)
*H01L 33/62*    (2010.01)
*H01L 33/38*    (2010.01)

(52) U.S. Cl.
CPC ............ *H01L 33/405* (2013.01); *H01L 33/145* (2013.01); *H01L 33/38* (2013.01); *H01L 33/62* (2013.01)

(58) Field of Classification Search
CPC ....... H01L 33/40; H01L 33/405; H01L 33/62; H01L 33/145
USPC ................................................... 257/88–103
See application file for complete search history.

(56) References Cited

U.S. PATENT DOCUMENTS

| | | | |
|---|---|---|---|
| 7,436,066 B2 | 10/2008 | Sonobe et al. | |
| 7,709,851 B2 | 5/2010 | Bader et al. | |
| 8,482,021 B2 | 7/2013 | Kim et al. | |
| 8,492,785 B2 | 7/2013 | Hodota | |
| 9,012,948 B2 * | 4/2015 | Chen .................. | H01L 27/15 257/91 |
| 9,112,114 B2 * | 8/2015 | Park .................. | H01L 33/40 |
| 2012/0286309 A1 | 11/2012 | Chae et al. | |

* cited by examiner

*Primary Examiner* — Cuong Q Nguyen
(74) *Attorney, Agent, or Firm* — Ditthavong & Steiner, P.C.

(57) ABSTRACT

A light-emitting device comprises a light-emitting stack comprising a first surface and a second surface opposite to the first surface; a first electrode formed on the second surface of the light-emitting stack; a current blocking layer formed on the first surface of the light-emitting stack and corresponding to a location of the first electrode; and a second electrode covering the current blocking layer and comprising a plurality of first metal layers and a plurality of second metal layers alternating with the plurality of first metal layers, wherein the plurality of first metal layers is discontinuous.

8 Claims, 5 Drawing Sheets

US 9,425,361 B2

LIGHT-EMITTING DEVICE

REFERENCE TO RELATED APPLICATION

This application is a continuation application of U.S. patent application, Ser. No. 14/681,291, which claims the right of priority based on TW application Serial No. 103112952, filed on Apr. 8, 2014, and the contents of which are hereby incorporated by references in their entireties.

TECHNICAL FIELD

The application relates to a light-emitting device, and more particularly, to a light-emitting device comprising a reflective layer.

DESCRIPTION OF BACKGROUND ART

The lighting theory of light-emitting diodes (LEDs) is that electrons and holes between an n-type semiconductor and a p-type semiconductor are combined in the active layer to release light. Due to the difference of lighting theories between LEDs and incandescent lamps, the LED is called "cold light source". An LED has the advantages of good environment tolerance, a long service life, portability, and low power consumption so it is regarded as another option for the lighting application. LEDs are widely adopted in different fields, for example, traffic lights, backlight modules, street lights, and medical devices and replace conventional light sources gradually.

An LED has a light-emitting stack which is epitaxially grown on a conductive substrate or an insulative substrate. The so-called "vertical LED" has a conductive substrate and includes an electrode formed on the top of a light emitting layer; the so-called "lateral LED" has an insulative substrate and includes electrodes formed on two semiconductor layers which have different polarities and exposed by an etching process. The vertical LED has the advantages of small light-shading area for electrodes, good heat dissipating efficiency, and no additional etching epitaxial process, but has a problem that the conductive substrate served as an epitaxial substrate absorbs light easily and is adverse to the light efficiency of the LED. The lateral LED has the advantage of radiating light in all directions due to a transparent substrate used as the insulative substrate, but has disadvantages of poor heat dissipation, larger light-shading area for electrodes, and smaller light-emitting area caused because of the epitaxial etching process.

The abovementioned LED can further connect to/with other components for forming a light-emitting device. For a light-emitting device, the LED can connect to a sub-carrier by the substrate side or by soldering material/adhesive material between the sub-carrier and the LED. Besides, the sub-carrier can further comprise a circuit electrically connected to electrodes of the LED via a conductive structure, for example, a metal wire.

SUMMARY OF THE APPLICATION

A light-emitting device comprises: a light-emitting stack including a first surface and a second surface opposite to the first surface, wherein the light-emitting stack emits a light having a wavelength between 365 nm and 550 nm; and a first electrode formed on the first surface and including a first metal layer and a second metal layer alternating with the first metal layer, wherein the first electrode has a reflectivity larger than 95% for reflecting the light, and the second metal layer has a higher reflectivity relative to the light than that of the first metal layer.

A light-emitting device comprises: a light-emitting stack comprising a first surface and a second surface opposite to the first surface, wherein the light-emitting stack emits a light having a wavelength between 365 nm and 550 nm, and the first surface comprises a first portion having a first conductivity and a second portion having a second conductivity; a first electrode, comprising a first electrode pad and a reflective stack comprising a first metal layer and a second metal layer alternating with the first metal layer, wherein the reflective stack is electrically connect to the first portion of the first surface and has a reflectivity larger than 95% for reflecting the light, and the second metal layer has a higher reflectivity relative to the light than that of the first metal layer; a second electrode, comprising a second electrode pad and an ohmic contact layer formed on the second portion of the first surface; and a carrier comprising a first contact pad electrically connected to the first electrode pad and a second contact pad electrically connected to the second electrode pad.

A light-emitting device comprises a light-emitting stack comprising a first surface and a second surface opposite to the first surface; a first electrode formed on the second surface of the light-emitting stack; a current blocking layer formed on the first surface of the light-emitting stack and corresponding to a location of the first electrode; and a second electrode covering the current blocking layer and comprising a plurality of first metal layers and a plurality of second metal layers alternating with the plurality of first metal layers, wherein the plurality of first metal layers is discontinuous.

DETAILED DESCRIPTION OF PREFERRED EMBODIMENTS

Referring to FIGS. 1A to 1E, a manufacturing method of a light-emitting device in accordance with a first embodiment of the present application is disclosed.

Figure 1A:
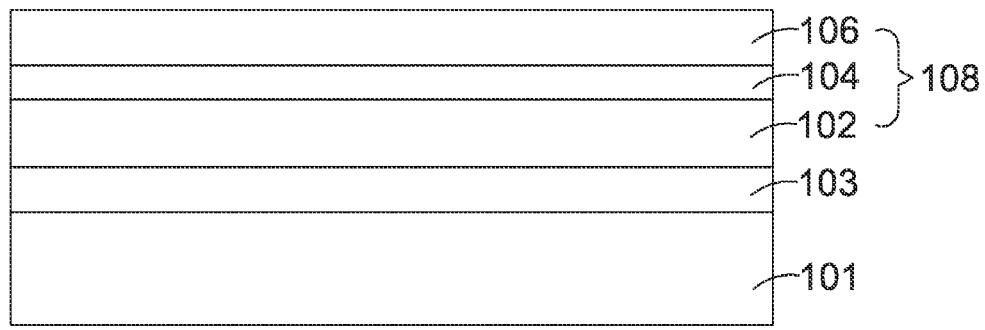
FIGS. 1A to 1E illustrate a manufacturing method of a light-emitting device in accordance with a first embodiment of the present application.

As shown in FIG. 1A, a buffer layer 103 and a light-emitting stack are epitaxially grown on a growth substrate 101. The growth substrate 101 can comprise transparent substrate such as sapphire, or conductive substrate such as SiC. The buffer layer 103 can comprise an un-intentionally doped AlN, AlGaN or GaN, and the light-emitting stack 108 can comprise GaN. The buffer layer 103 can reduce the defect resulted from the lattice mismatch between the growth substrate 101 and the light-emitting stack 108. The light-emitting stack 108 can comprise a first semiconductor layer 102, an active layer 104, and a second semiconductor layer 106. The first semiconductor layer 102 and the second semiconductor layer 106, for example, can be cladding layer or confinement layer, capable for providing electrons and holes, and the electrons and holes can be combined in the active layer 104 to emit light. The first semiconductor layer 102, the active layer 104, and the second semiconductor layer 106 can comprise III-V group semiconductor material such as $Al_xIn_yGa_{(1-x-y)}N$, $0 \leq x$, $y \leq 1$; $(x+y) \leq 1$. In accordance with the material of the active layer 104, the emitted light thereof can be green light having a wavelength between 530 nm and 570 nm, blue light having a wavelength between 450 nm and 490 nm, or ultraviolet light having a wavelength between 365 nm and 405 nm. The first semiconductor layer 102 can comprise an n-type semiconductor layer and the second semiconductor layer 106 can be a p-type semiconductor layer.

Figure 1B:
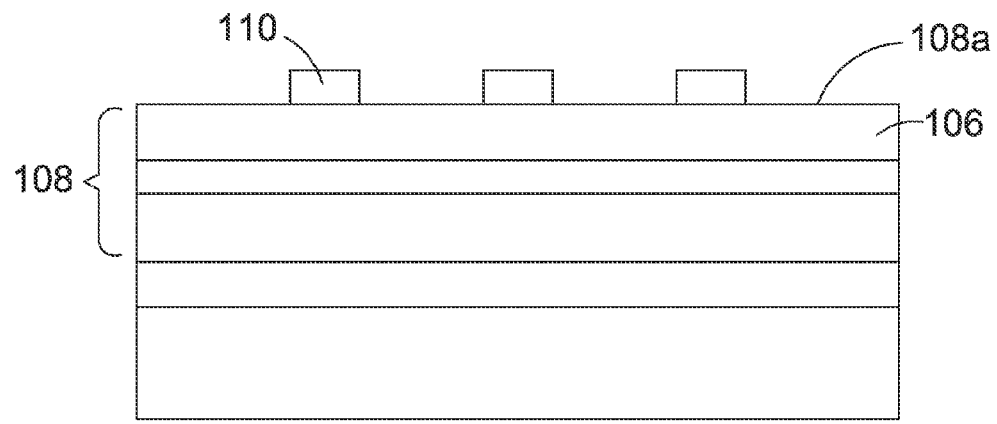

As shown in FIG. 1B, a patterned current-blocking layer 110 is formed on the first surface 108a of the light-emitting stack 108, that is, the patterned current-blocking layer 110 is formed on the second semiconductor layer 10. The current blocking layer can be insulating oxide such as $SiO_2$ or $TiO_2$, or can be nitride such as $SiN_x$.

Figure 1C:
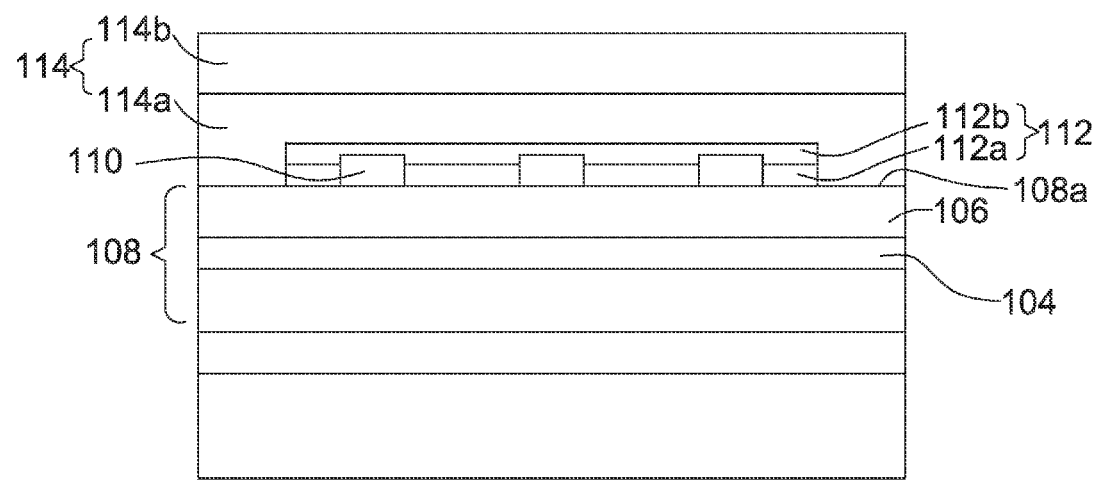

As shown in FIG. 1C, a first electrode 112 can be formed on the first surface 108a of the light-emitting stack 108 and cover the current blocking layer 110. Then a barrier layer 114 comprising a first barrier layer 114a and a second barrier layer 114b can be formed on the uncovered region of the first surface 108a and the first electrode 112. The current blocking layer 110 is entirely covered by the first electrode 112, and on the first surface 108a the first electrode 112 is narrower than the barrier layer 114.

The first electrode 112 can be a reflective stack comprising a first metal layer 112a and a second metal layer 112b alternating with the first metal layer 112a, and the thermal stability of the first metal layer 112a is better than that of the second metal layer 112b, and the reflectivity of the second metal layer 112b is higher than that of the first metal layer 112a. For example, the first metal layer 112a can be Al and the second metal layer 112b can be Ag. Further referring to FIG. 1F, the first metal layer 112a and a second metal layer 112b can alternate with each other for 2 to 12 times. In the embodiment, the first electrode 112 comprises a first metal layer 112a directly contacting the first surface 108a. The barrier layer 114 can comprise an alloy or a stack comprising Ti, W, Pt, and Ni. The thickness of the first metal layer 112a can be between 1~10 Å, and the thickness of the second metal layer 112b can be between 100~700 Å. To be more specific, the thickness of the first metal layer 112a can be approximately 3 Å, wherein the first metal layer 112 may be discontinuous or embedded in the second metal layer 112b, and the total thickness of the first electrode 112 can be between 1400 Å and 1500 Å, or even thicker than 1500 Å. To make the first electrode 112 ohmically contact the second semiconductor layer 106 of the light-emitting stack 108, a Rapid Thermal Annealing (RTA) process can be proceeded under a condition of 500° C. and 40 minute after the first electrode 112 is formed. For example, when the second metal 112b is Ag and the second semiconductor layer 106 is p-type GaN, a high temperature annealing for Ag and p-type GaN is proceeded, and the first metal layer 112a can stabilize the second metal layer 112b when the high temperature annealing is performed. Beside pure Al, the first metal layer 112a can be an alloy or stack comprising Al, Ti, W, Pt or Ni.

Figure 1D:
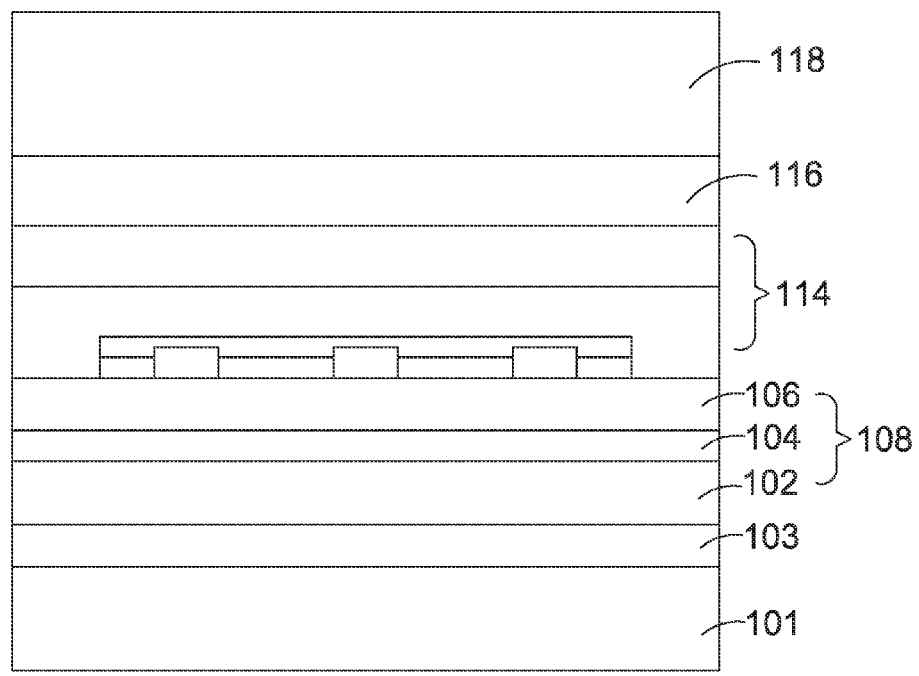

Referring to FIG. 1D, a conductive substrate 118 is provided to attach to the light-emitting stack 108 via a conductive bonding layer 116. The conductive bonding layer 116 is between the conductive substrate 118 and the barrier layer 114 and comprises metal such as Au, In, Ni or the alloy thereof. The light-emitting stack 108 comprises a first semiconductor layer 102, an active layer 104, and a second semiconductor layer 106, and is between the growth substrate 101 and the conductive substrate 118. A laser (not shown) can be provided to decompose the buffer layer 103 so as to remove the growth substrate 101, and residues of the buffer layer 103 can be cleaned by dry etching and wet etching.

Figure 1E:
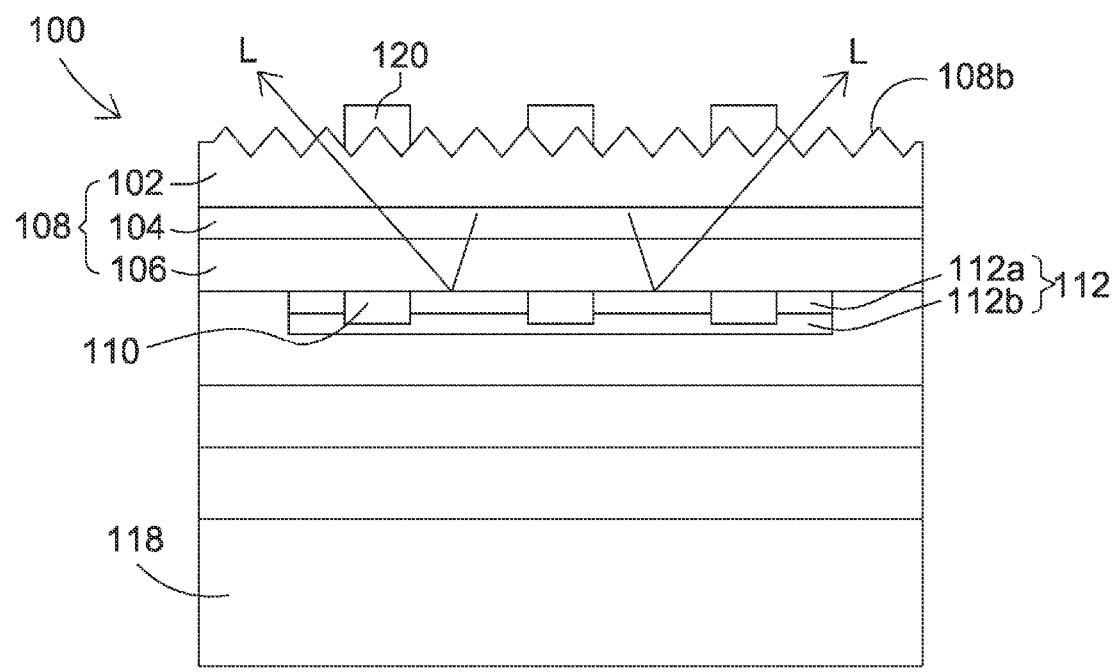
Figure 1F:
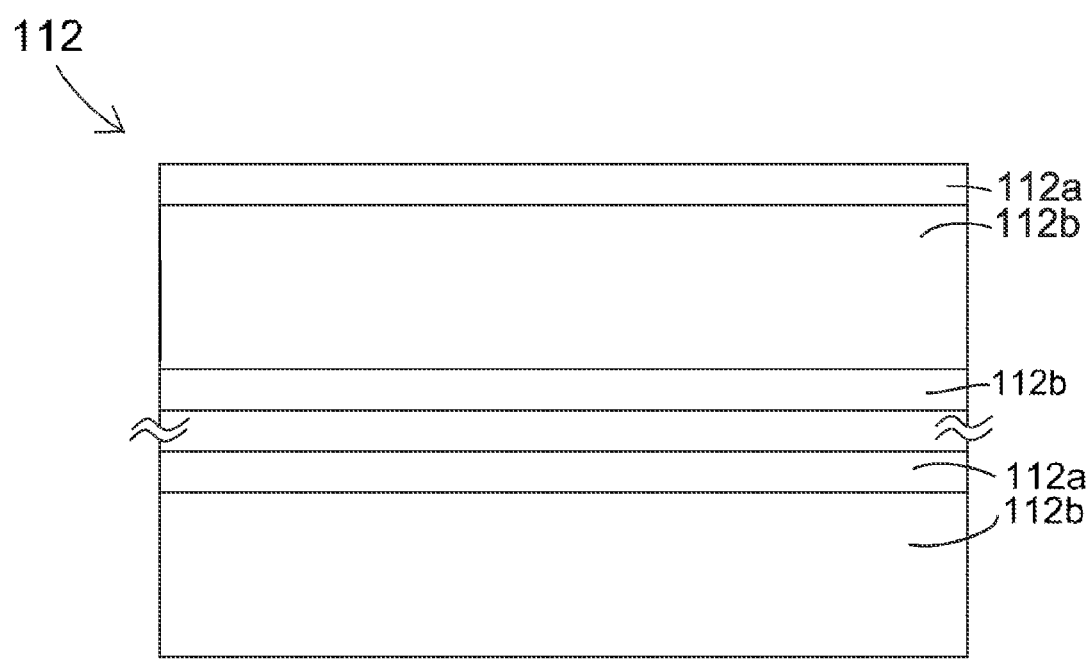
FIG. 1F illustrates a light-emitting stack in accordance with the first embodiment of the present application.

Please refer to FIG. 1E, the light-emitting stack 108 can expose a second surface 108b after the removal of the buffer layer in FIG. 1D. The second surface 108b serves as a primary light-extraction surface and is also a surface of the first semiconductor layer 102, and the second surface 108b can be a roughing surface to increase light-extraction efficiency. A second electrode 120 can be formed on the second surface 108b and corresponds to the location of the current blocking layer 110.

When a driving current is injected into the light-emitting stack 108 via the second electrode 120 and the conductive substrate 118, the active layer 104 can emit light L resulted from the combination of electrons and holes, and the light L can be reflected by the first electrode 112 and extracted out from the second surface 108b. In the embodiment, when the wavelength of the light is between 365 nm to 550 nm, the reflectivity of the first electrode 112 can be higher than 95%, and can be even up to 98% to 100%. In the embodiment, the first electrode 112 is composed of the first metal layer 112a having high thermal stability and the second metal layer 112b having high reflectivity so the problem of substantially reduced reflectivity caused by the high temperature annealing of high reflective metal (e.g. Ag) and the semiconductor layer in the conventional art is relieved. The origin of the problem is that the high reflectivity metal such as Ag is unstable after high temperature annealing. Moreover, when the light-emitting stack of conventional art receives a high current larger than 350 mA, the high reflectivity metal becomes more unstable and the reflectivity thereof is further decreased. In the embodiment, the first metal layer 112a has a high reflectivity close to that of the second metal 112b and has a better ohmic contact with the second semiconductor layer 106, and the first metal layer 112a has better thermal stability than that of the second metal layer 112b, therefore the first metal layer 112a can keep the second metal 112b stable under high temperature annealing to avoid the reflectivity from dramatically reducing after high temperature annealing. Besides, in one experiment, the reflectivity of the first electrode 112 is not obviously decreased even a current higher than 350 mA is provided to the light-emitting stack 108.

Figure 2:
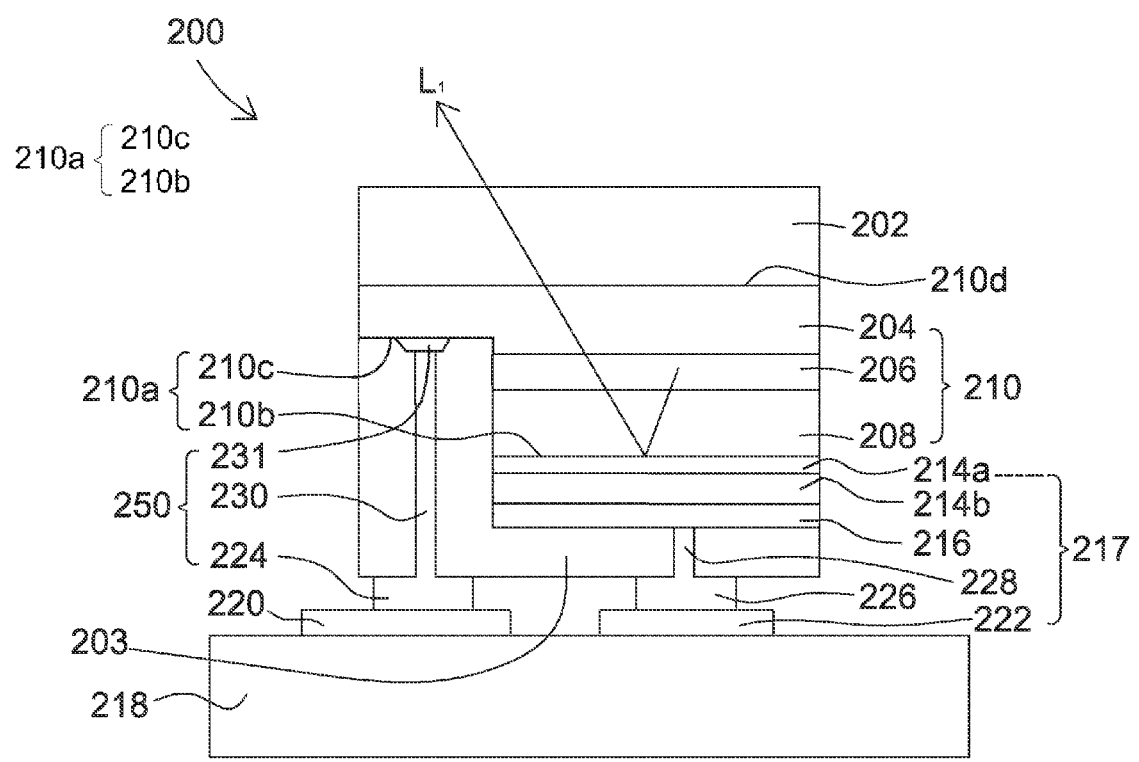
FIG. 2 illustrates a light-emitting device in accordance with a second embodiment of the present application.

Referring to FIG. 2, a light-emitting device in accordance with a second embodiment of the present application is illustrated. A light-emitting device 200 comprises: a light-emitting stack 210 comprising a first surface 210a and a second surface 210d opposite to the first surface 210a, and the light-emitting stack 210 emits a light $L_1$ having wavelength equal to that of the light L of the first embodiment, and the first surface 210a comprises a first portion 210b having a first conductivity and a second portion having a second conductivity, a first electrode 217 comprising a first electrode pad 226 and a reflective stack comprising a first metal layer 214a and a second metal layer 214b alternating with the first metal layer 214a, wherein the reflective stack is electrically connected to the first portion 210b of the first surface 210a and having a reflectivity lager than 95% relative to light $L_1$ so the light $L_1$ is emitted out the light-emitting stack 210 from the second surface 210d, a second electrode 250 comprising a second electrode pad 224 and an ohmic contact layer 231 formed on the second portion 210c of the first surface 210a, and a carrier 218 comprising a first conductive pad 222 electrically connected to the first electrode 217 and a second conductive pad 220 electrically connected to the second electrode pad 224. The light-emitting stack 210 comprises a first semiconductor layer 204 having two sides on which the second portion 210c of the first surface 210a and the second surface 210d are formed on, respectively, an active layer 206, and a second semiconductor layer 208 comprising the first portion 210b of the first surface 210a. The second portion 210c of the first surface 210a is formed by removing a part of the second semiconductor layer 208 and the active layer 206. An insulating layer 203 is formed on the first surface 210a of the light-emitting stack 210 and a trench can be formed by etching process, and a metal can be filled into the trench to form a conductive channel. The first electrode 217 can further comprise a barrier layer 216 covering the reflective stack formed by the first metal layer 214a and the second metal layer 214b and a first conductive channel 228 penetrating through the insulating layer 203 wherein the two ends of the first conductive channel 228 are electrically connected to the barrier layer 216 and the first electrode pad 226. The first metal layer 214a and the second metal layer 214b comprise the same material as those in the first embodiment. The first metal layer 214a can directly contact the second semiconductor layer 208, and in the embodiment the first metal layer 214a and the second metal layer 214b can alternate with each other for 2 to 12 times, therefore further raising the reflectivity over 95% relative to the light $L_1$, even up to 98% to 100%. In another embodiment, a metal oxide (not shown) can be formed between the first electrode 217 and the second semiconductor layer 208 to promote current-spreading effect. The second electrode 250 further comprises a second conductive channel 230 having two ends connected to the ohmic contact layer 231 and the second electrode pad 224. A transparent substrate 202 can be formed on the second surface 210d of the light-emitting stack 210, and the transparent substrate 202 can be a growth substrate such as sapphire for epitaxially growing the light-emitting stack 210. In another embodiment, the transparent substrate 202 can be removed and the second surface 210d can be a roughing surface by an etching process. The first electrode pad 226, the second electrode pad 224, the first conductive channel 228 and the second conductive channel 230 can be a stack composed of metals such as Ni, Au and/or Ti. The ohmic contact layer 231 of the first electrode 250 can be a stack composed of metals such as Cr, Pt, and/or Au. Areas of the first electrode pad 226 and the second electrode pad 224 can be larger than the cross-sectional areas of first conductive channel 228 and the second conductive channel 230, respectively, and both of the first electrode pad 226 and the second electrode pad 224 are extended on the surface of the insulating layer 203 for receiving a high current from the carrier 218.

Although the present application has been explained above, it is not the limitation of the range, the sequence in practice, the material in practice, or the method in practice. Any modification or decoration for present application is not detached from the spirit and the range of such.

What is claimed is:

1. A light-emitting device, comprising:
   a light-emitting stack comprising a first surface and a second surface opposite to the first surface;
   a first electrode formed on the second surface of the light-emitting stack;
   a current blocking layer formed on the first surface of the light-emitting stack and corresponding to a location of the first electrode; and
   a second electrode covering the current blocking layer and comprising a plurality of first metal layers and a plurality of second metal layers alternating with the plurality of first metal layers, wherein the plurality of first metal layers is discontinuous.

2. The light-emitting device of claim 1, wherein the plurality of second metal layers alternates with the plurality of first metal layers for 2 to 12 times.

3. The light-emitting device of claim 1, wherein the plurality of first metal layers comprises Al, Ti, W, Pt or Ni.

4. The light-emitting device of claim 1, wherein the plurality of second metal layers comprises a thickness between 100 Å and 700 Å.

5. The light-emitting device of claim 1, wherein the light-emitting stack comprises a first semiconductor layer comprising the second surface, a second semiconductor layer comprising the first surface and an active layer between the first semiconductor layer and the second semiconductor layer, and the first electrode is formed on a part of the first surface, and the light is emitted out the light-emitting stack from the second surface.

6. The light-emitting device of claim 1, wherein one of the plurality of first metal layers directly contacts the first surface of the light-emitting stack.

7. The light-emitting device of claim 1, further comprising a conductive substrate, and a conductive bonding layer formed between the conductive substrate and the second electrode.

8. The light-emitting device of claim 1, wherein the first electrode comprises a pattern.

* * * * *